United States Patent [19]

Carr

[11] Patent Number: 4,766,370
[45] Date of Patent: Aug. 23, 1988

[54] SYSTEM AND METHOD FOR CALIBRATING AN ENERGY METER

[75] Inventor: John M. Carr, Millville, N.J.

[73] Assignee: The Eastern Specialty Company, Philadelphia, Pa.

[21] Appl. No.: 599,544

[22] Filed: Apr. 12, 1984

[51] Int. Cl.⁴ ................. G01R 11/32; G08B 23/00
[52] U.S. Cl. ............................. 324/74; 324/130; 340/637
[58] Field of Search ............ 324/74, 77 G, 161, 130; 364/571; 340/637; 318/314, 311, 313; 346/14 MR

[56] References Cited

U.S. PATENT DOCUMENTS

| 2,938,165 | 5/1960 | Greig | 324/74 |
| 2,957,131 | 10/1960 | Burkhart, Jr. | 324/74 |
| 3,204,532 | 9/1965 | Budnick | 318/313 |
| 3,409,829 | 11/1968 | Elmore et al. | 324/74 |
| 3,654,479 | 4/1972 | Catherin | 318/314 |

FOREIGN PATENT DOCUMENTS

| 1075215 | 2/1960 | Fed. Rep. of Germany | 324/74 |
| 1283957 | 11/1968 | Fed. Rep. of Germany | 324/74 |

OTHER PUBLICATIONS

Levitsky, "A Test Board for Watt Meter Standards", Jul. 1955, p. 605.
Holtz, "Apparatus for Testing A-C Watt-Hour Meters", May 1952, p. 413.
"New Precise Comparison Methods of Testing Watt-hour Meters", IEEE Transactions of Instrumentation and Measurement, vol. IM-25, No. 3, 1976, by J. Ludmer.
"A Digital Error Indicator for Electricity Meter Testing", Siemens Review XXXI, 1972, No. 11, by Klaus Walter.
"Error Indicator for Energy Meters", Journal of the Institution of Engineers (India), Electronic Eng. Div., vol. 53, Apr. 1973.

Primary Examiner—Ernest F. Karlsen
Assistant Examiner—Vinh P. Nguyen
Attorney, Agent, or Firm—Dann, Dorfman, Herrell and Skillman

[57] ABSTRACT

A system for calibrating an energy meter is provided. The energy meter has a rotor which rotates at an angular velocity generally proportional to the energy input to the meter. A reference transducer receives an energy input for generating a reference signal having a predetermined parameter, such as frequency, generally proportional to the energy input. A test apparatus is responsive to rotation of the rotor to generate a test signal having a predetermined parameter, such as frequency, generally proportional to the angular velocity of the rotor. An error signal generator receives the reference signal and the test signal upon fractional rotation of the rotor and generates an error signal to indicate the amount of error between the frequency of the test signal and a calibration value corresponding to the frequency of the reference signal. The meter is calibrated based on the error signal. A related method is also disclosed for calibrating the meter.

12 Claims, 1 Drawing Sheet

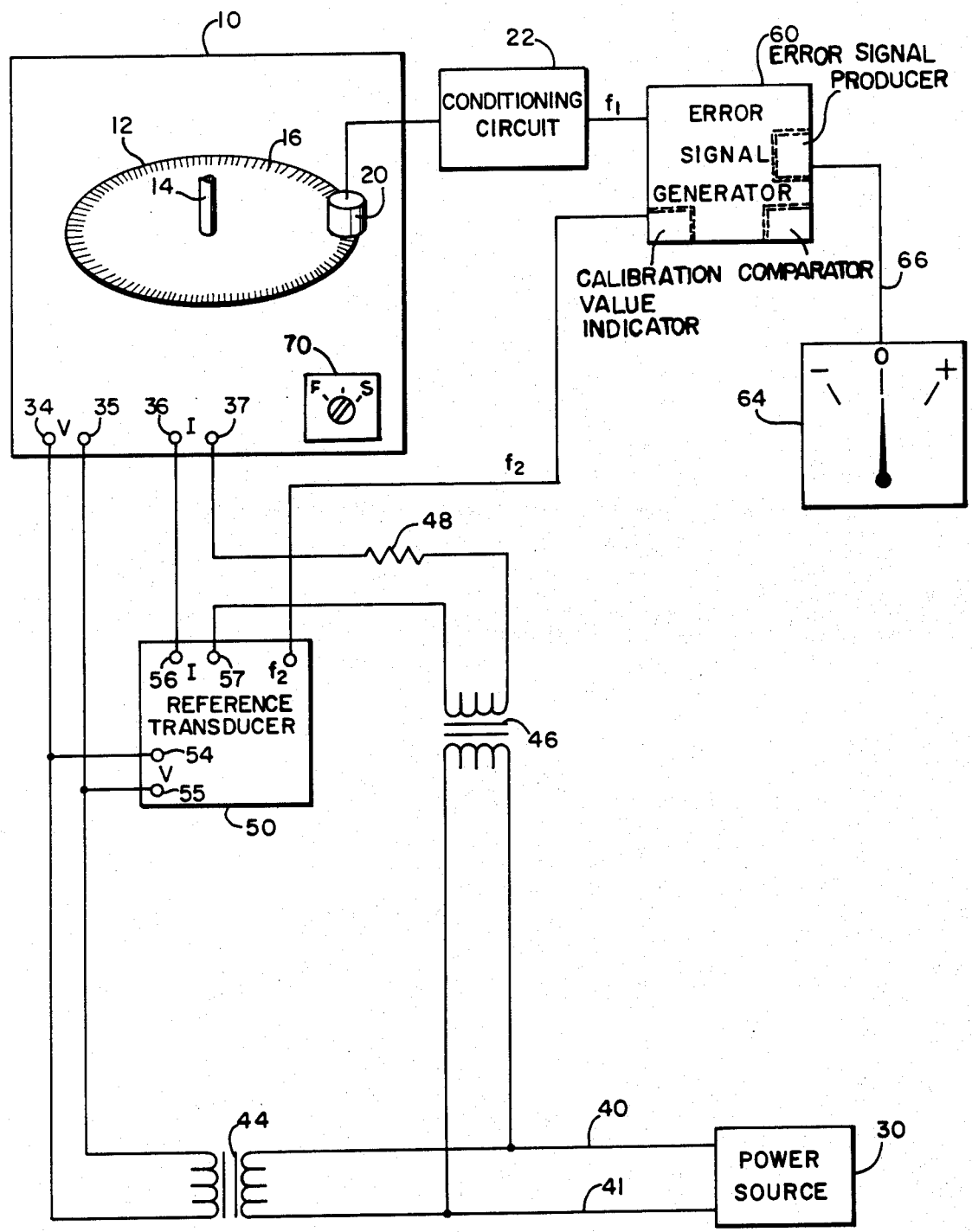

SYSTEM AND METHOD FOR CALIBRATING AN ENERGY METER

FIELD OF THE INVENTION

The present invention relates to a system and method for calibrating energy meters, such as watthour meters, Q-hour meters and varmeters.

BACKGROUND OF THE INVENTION

The effective measurement of energy usage can only be obtained if the measuring instruments are accurately calibrated to a proper standard or within acceptable limits of the standard. Improperly calibrated meters result in inaccurate measurements of actual energy usage and introduce an unknown amount of error into any calculations based upon such measurements. In the context of a residential electric meter, accurate measurement of the customer's energy usage is important so that the customer can be properly charged.

Proper calibration of energy meters is not limited to residential electric meters. It is also extremely important for meters used in various other applications, such as in industrial uses and scientific experimentation to, be accurately calibrated. Due to the vast number of industrial and residential meters currently in use, such as watthour meters. Q-hour meters and varmeters, accurate and expeditious calibration techniques are needed to efficiently calibrate large numbers of meters desired to be calibrated and recalibrated.

Conventional methods of calibrating energy meters require that precision currents and potentials be applied to the meter under test so that accurate readings can be obtained. Once connected to the energy source, the rotation of the meter rotor is then accurately timed for an integral number of revolutions. At a minimum, at least one complete revolution of the rotor in the meter is required in conventional measurement systems and more accurate readings are obtained if several complete revolutions are timed. The time period for the rotor of the meter to complete one or more revolutions is then calculated and compared to a standardized time period for acceptable calibration for the type of meter being tested. The difference between the actual and the standard time period is then calculated so that a corresponding adjustment can be made to the meter under test.

After an initial adjustment, the meter must once again be tested to verify accurate adjustment for proper calibration within acceptable limits. This type of conventional testing often requires many individual test runs and corresponding meter adjustments because the calibrating adjustments of the meters are typically not linear. As a result, conventional calibration of energy meters has been an extremely inefficient and time-consuming process. A significant problem is that energy changes or fluctuations during the test procedure result in inaccurate readings which do not properly reflect the extent to which a meter may be out of calibration.

Another conventional system employed in the prior art for calibration of meters involves the use of a reference device to generate a reference signal having a selected frequency which is upplied to a counter. Integral revolutions of the test meter rotor are then used to gate the counter on and off so that the counter functions to count and store the number of reference signal pulses supplied to the counter during one or more integral revolutions of the test meter rotor. This type of system has the inherent inefficiency of requiring one or more complete revolutions of the test meter rotor before calibration adjustment can even be started. Complete revolutions are again required for additional test runs for further calibration.

In accordance with the present invention, a system and a method for calibrating energy meters are provided which eliminate the inefficiencies of conventional systems. The method and system of the present invention do not require precision currents and potentials in order to calibrate the energy meters. In addition, the necessity of timing the rotation of the rotor is eliminated. Adjustment of the energy meters can be effected based upon non-integral revolutions of the test meter rotor and, in fact, proper calibration adjustment can be made upon only a fractional revolution of the test meter rotor, thereby substantially reducing the time required to calibrate the meter.

SUMMARY OF THE INVENTION

Briefly stated, the present invention provides a system for calibrating an energy meter which receives an energy input and has a rotor which rotates at an angular velocity generally proportional to the energy input to the meter. The energy meter to be calibrated also has calibration means for adjusting the speed of the rotor for a given energy input. The system comprises reference means which receives an energy input and generates a reference signal having a predetermined parameter generally proportional to the energy input. In the preferred embodiment of the invention, the frequency of the reference signal is the predetermined parameter which is dependent upon the energy input, and the reference means and energy meter are connected to the same energy input. Test means is provided in communication with the rotor for generating a test signal having a predetermined parameter generally proportional to the angular velocity of the rotor. Similarly, in the preferred embodiment, the frequency of the test signal is the predetermined parameter which is generally proportional to the angular velocity of the rotor.

Error signal generator means is responsive to the reference signal from the reference means and the test signal from the test means. The error signal generator means compares the reference and test signals to generate an error signal upon fractional rotation of the rotor when the parameter of the test signal is different from a predetermined calibration value corresponding to the parameter of the reference signal, which indicates proper calibration for the energy input into the meter. Indicator means is employed for indicating the presence of an error signal. The amount of the error signal reflects the error in meter calibration. The calibration means of the energy meter may be adjusted for changing the test signal to correspond to the predetermined calibration value to provide proper calibration.

A method is also provided for calibrating an energy meter which receives an energy input and has a rotor which rotates at an angular velocity generally proportional to the energy input to the meter. The meter also has calibration means for adjusting the speed of the rotor for a given energy input. The method comprises generating a reference signal having a predetermined parameter generally proportional to the energy input. A test signal is generated having a predetermined parameter generally proportional to the angular velocity of the rotor. The reference signal and test signal are compared and an error signal is generated when the predetermined parameter of the test signal is different from a predetermined calibration value corresponding to the parameter of the reference signal. The presence of the error signal is indicated and the calibration means is adjusted to change the test signal to correspond to the predetermined calibration value to provide proper calibration.

BRIEF DESCRIPTION OF THE DRAWING

The foreoing summary, as well as the following detailed description of a preferred embodiment of the present invention, will be better understood when read in conjunction with the appended drawing, in which:

The FIGURE shows a general schematic diagram of the energy meter to be calibrated and the calibration system, including electrical circuitry, in accordance with the present invention.

DESCRIPTION OF THE PREFERRED EMBODIMENT

Referring to the drawing, there is depicted an energy meter 10, which may be of a variety of types, such as a watthour meter, a Q-hour meter or a varmeter. The meter 10 is schematically illustrated and shown under test to determine possible error in calibration. The energy meter 10 includes a disc-type rotor 12 mounted on a rotational shaft 14. The energy meter is configured so that rotor 12 rotates at an angular velocity generally proportional to the energy input to the meter. The rotation of the rotor functions to record energy usage by cooperating with dials or other suitable recording means.

The outer periphery of the rotor is marked with a series of uniformly-spaced markings 16. To detect the rotational velocity of the rotor in determining calibration of the meter, detection means, generally designated 20, communicates with the rotor. For this purpose, the detection means 20 is provided by a scanner, preferably in the form of a photo optical scanner, and is disposed along the outer periphery of the rotor to detect the movement of the uniformly-spaced markings 16 during movement of the rotor. As the markings pass adjacent the scanner and are sensed by the scanner, a pulsed output is generated by the scanner 20, so that the frequency of the output pulses corresponds to the frequency of the markings passing by the scanner.

The pulsed output signal is supplied to a signal conditioning circuit 22, which functions to amplify the pulsed output signal from the scanner and generate a suitable test signal, such as a square wave, having a frequency $f_1$ generally proportional to the rotational velocity of the rotor. As the rotational velocity of the rotor increases, there is a proportional increase in frequency $f_1$. Similarly, as the rotational velocity of the rotor decreases, there is a proportional decrease in frequency $f_1$. In the present arrangement, the scanner 20 and the conditioning circuit 22 function as a test means, which communicates with the rotor to generate a test signal having a predetermined signal parameter, namely the frequency, generally proportional to the angular velocity of the rotor.

Power source 30 functions to supply an energy input to the energy meter 10. For this purpose, the power source is connected with voltage input terminals 34 and 35 and current input terminals 36 and 37 of the energy meter 10. If a polyphase meter is under test, additional current and voltage input terminals are provided on the meter. To supply voltage to the energy meter 10, the output conductors 40 and 41 from the power source 30 are connected with a tapped transformer 44, which is configured to supply different voltage potentials to the voltage input terminals 34 and 35 of the energy meter 10. Similarly, to supply current to the meter, output conductors 40 and 41 from power source 30 are connected to a second tapped transformer 46, which is configured to supply different current inputs to the current input terminals 36 and 37 of the energy meter. A precision resistor 48 preferably is provided intermediate one side of tapped transformer 46 and terminal 37 of the energy meter, so that a desired current level is supplied to the meter.

The test system includes reference means in the form of a reference transducer 50, which is connected with power source 30, so that the instantaneous energy supplied to the energy meter 10 is also simultaneously supplied to the reference transducer 50. For this purpose, voltage input terminals 54 and 55 of reference transducer 50 are connected to tapped transformer 44 in a circuit in parallel with the connection to the energy meter. Current input terminals 56 and 57 of the reference transducer 50 are similarly connected to tapped transformer 46 to be in series with the current input terminals 36 and 37 of the energy meter 10.

The reference transducer 50, such as a time division multiplier, generates an output reference signal having an output frequency $f_2$ generally proportional to the energy input to the reference transducer, which, of course, is also proportional to the energy input to the energy meter by virtue of the common connection with the power source. As the energy input to the reference means 50 varies, the frequency $f_2$ of the output reference signal varies proportionally. Accordingly, in the circuit arrangement described, the reference means receives as its input the same instantaneous energy supplied to the energy meter 10 and generates an output reference signal having a predetermined signal parameter, namely the frequency $f_2$, which is generally proportional to the energy input. Hence, in this arrangement, for any fluctuation in energy input to the reference transducer, causing a change in its output, there will be a corresponding fluctuation in energy input to the energy meter, causing a similar change in its output, so that the outputs are synchronized for accurate calibration despite fluctuations in energy input.

Error signal generator means 60 is connected with the output of reference means 50 and the output of the test means, as provided by the scanner 20 and the conditioning circuit 22 for the scanner 20, and functions to detect a difference in a predetermined relationship between the test and reference signals. Accordingly, the error signal generator means 60 is responsive to the reference signal $f_2$ and the test signal $f_1$ and functions to generate an error signal indicating the amount that the test meter is out of calibration upon fractional rotation of the test meter rotor. More specifically, the error signal generation means compares the frequency $f_1$ of the test signal, which reflects the actual rotational velocity of the test meter rotor, with a predetermined calibration value dependent on the frequency $f_2$ of the reference signal. The calibration value represents the desired rotational velocity of the rotor and the calibration value changes as a function of the frequency $f_2$ of the reference signal being received by the error signal generator means 60. For this purpose, the error signal generator means 60 preferably includes means for computing or indicating the desired calibration value as a function of the frequency domain level of the reference signal.

For the error signal generator means to carry out its comparison function, it is preferably provided with memory means which stores a table of desired calibration values as a function of the frequency domain of frequency $f_2$. The table represents the correlation between the frequency range of the reference signal and the corresponding calibration values to be attained by the test signal. The calibration value, in essence, represents the desired frequency of the test signal when the energy meter under test is accurately calibrated for the instantaneous energy input being supplied to the meter. In order to compare the frequency $f_1$ of the test signal with the desired calibration value, the error signal generator means includes means for selecting the desired calibration value from the memory means for the particular frequency $f_2$ of the reference signal being received by the error signal generator means. The error signal generator means also includes comparator means for comparing the calibration value with the actual value of the frequency $f_1$ of the test signal to determine the difference, if any, therebetween whereby such difference represents error in calibration of the energy meter.

It should be appreciated that a direct comparison of the reference and test signal and, in particular, the respective predetermined parameters, such as frequency $f_1$ and $f_2$, could be made if the reference means is configured to produce an output reference signal having a predetermined parameter such as frequency $f_2$ at the selected calibration value for the instantaneous energy input being supplied to the reference means and the test meter. In such circumstances, the calibration value would simply be the actual value of the frequency $f_2$ being produced by the reference means. Accordingly, frequency $f_1$ would be directly compared with frequency $f_2$, representing the calibration value, and the error signal difference therebetween would represent the error between frequency $f_1$ and $f_2$.

The error signal generator means produces an error signal so that the error signal has a selected parameter generally proportional to the difference between the calibration value and the value of the frequency $f_1$ of the test signal. In the preferred arrangement of the system of the present invention the error signal is produced as an output signal having a magnitude representing the amount of error and a polarity indicating whether the meter is running fast or slow. To assist the operator, the error output signal is supplied to indicator means 64 to indicate the presence of an error signal. In the present arrangement, the indicator means is shown as a display means in the form of a null indicating device, which is connected to error signal generator 60 by output line 66. The display means 64 functions to display the magnitude and polarity of the error signal and in effect, the display means displays the amount of error and whether the meter under test is running fast or slow. It should be noted and appreciated, however, that the indicator means could comprise an output which is supplied to a servo-mechanism to effect an adjustment to the speed of the rotor.

By viewing the display means 64, an operator can quickly determine whether the rotor speed of the meter under test must be advanced or retarded and continuously make necessary adjustments while viewing the display means. As adjustment is made to the meter through its calibration adjustment means 70, the display means will reflect the extent of the adjustment. Calibration adjustments are continuously made until a null is indicated on the display means, indicating that the value of the test signal corresponds to the predetermined calibration value represented by the reference signal. Accordingly, the null device will indicate the point of perfect calibration.

During operation of the system, the error signal is generated as soon as the meter rotor begins to rotate. Once the power source is connected with the reference means and the energy meter being tested, the meter rotor will rotate generating the requisite test signal, while the reference means generates the requisite reference signal. The test and reference signals are supplied to the error signal generator and the resulting error signal is virtually instantaneously produced upon only a fractional revolution of the meter rotor. A fairly accurate reading can be obtained in approximately one-fifth of a rotor revolution which permits immediate dynamic adjustment and enables accurate and rapid calibration.

Since the calibration of the meter in the system of the present invention is not based upon accurate timing of the rotor revolutions, as in the prior art, precise current and voltage inputs are not required. If the energy input to the energy meter inadvertently fluctuates during calibration with the system of the present invention causing a change in the frequency $f_1$ of the test signal, a similar change in the frequency $f_2$ of the reference signal also results to self-compensate for such change in frequency $f_1$. This latter effect occurs because the instantaneous energy input to the energy meter is also simultaneously being supplied to the reference means. Since the time period of revolution of the rotor is irrelevant, the calibration of the meter is not adversely affected. Another important aspect of the present invention is that the error in calibration is displayed as soon as there is only a fractional revolution of the rotor, and one need not wait for an integral revolution. Since the error in calibration is not dependent upon the time period of revolution, calibration can be more quickly achieved.

From the foregoing description of the preferred embodiment, it can be seen that the present invention provides a system and method for efficiently calibrating energy meters. It will be recognized by those skilled in the art that changes and modifications may be made to the above-described embodiment without departing from the broad inventive concepts of the invention. In it understood, therefore, that this invention is not limited to the particular embodiment shown and described herein, but is intended to cover all changes and modifications which are within the scope and spirit of the invention as set forth in the appended claims.

What is claimed is:

1. A system for calibrating an energy meter having input means for receiving electrical energy and a rotor having a periphery which rotates at an angular velocity generally proportional to the electrical energy input into the meter, said system comprising:
    (a) reference means having input means for receiving electrical energy, said reference means generating a reference signal having a predetermined signal parameter generally proportional to the electrical energy input into the reference means;
    (b) a plurality of marks disposed around the periphery of the rotor;
    (c) detection means communicating with the rotor for detecting the marks on the rotor and generating a test signal having a predetermined signal parameter generally proportional to the angular velocity of the rotor;

(d) a source of electrical energy connected in common to the energy meter and said reference means such that substantially the same electrical energy is input to both the energy meter and said reference means;

(e) error signal generator means responsive to the reference signal from the reference means and the test signal from the detection means for sensing a difference in a predetermined relationship between the signal parameter of the test signal and the signal parameter of the reference signal during at least a fractional rotation of the rotor and for generating an error signal representing the amount of error in the calibration of the energy meter when a difference in said predetermined relationship is sensed upon said fractional rotation of the rotor;

(f) indicator means connected with the error signal generator means to receive the error signal for indicating the magnitude and polarity of error in the calibration of the energy meter and for indicating changes in the magnitude and polarity of the error in the calibration of the energy meter; and (g) calibration adjustment means associated with the energy meter for adjusting the angular velocity of the rotor while the calibration error is indicated by said indicator means so that changes in the magnitude and polarity of the error in calibration are indicated by the indicator means during adjustment to provide essentially continuous adjustment of meter calibration until the signal parameter of the test signal corresponds to the predetermined relationship with the signal parameter of the reference signal and the energy meter is thus properly calibrated.

2. The system as set forth in claim 1 wherein the indicator means includes display means for displaying a representation of the magnitude and polarity of the error signal.

3. The system as set forth in claim 1 wherein the predetermined signal parameter of the test signal and the predetermined signal parameter of the reference signal are frequencies.

4. The system as set forth in claim 1 wherein the error signal generator means generates the error signal with a predetermined signal parameter generally proportional to the difference in the predetermined relationship between the predetermined signal parameter of the test signal and the predetermined signal parameter of the reference signal.

5. The system as set forth in claim 1 wherein the error signal generator means includes:
(a) means for indicating a calibration value dependent on the predetermined signal parameter of the reference signal;
(b) comparator means for comparing the calibration value to the signal parameter of the test signal; and
(c) means for producing said error signal having a signal parameter proportional to the difference between the calibration value and the signal parameter of the test signal.

6. The system in accordance with claim 1 wherein the input means of the meter includes a voltage input and a current input and the input means of the reference means includes a voltage input and a current input and wherein said electrical energy source includes connecting means for connecting the respective voltage inputs in parallel with one another and said respective current inputs in series with one another.

7. The system in accordance with claim 6 wherein said connecting means includes a resistor connected in series with the respective current inputs.

8. A method for calibrating an energy meter having input means for receiving electrical energy, a rotor having a periphery with a plurality of marks disposed thereon, which rotates at an angular velocity generally proportional to the electrical energy input into the meter, and calibration means for adjusting the angular velocity of the rotor relative to the electrical energy input into the meter, the method comprising the steps of:

providing electrical energy from a source into the energy meter so that the rotor begins to rotate at an angular velocity;

generating a reference signal having a predetermined signal parameter generally proportional to the electrical energy input into the meter;

detecting the marks on the rotor as it rotates in response to the electrical energy;

generating a test signal from the detected marks, said test signal having a predetermined signal parameter generally proportional to the angular velocity of the rotor;

establishing a predetermined relationship between the signal parameter of the test signal and the signal parameter of the reference signal which relationship represents the proper calibration of the energy meter;

senseing any difference in the predetermined relationship between the signal parameter of the test signal and the signal parameter of the reference signal during at least a fractional rotation of the rotor, said difference representing an error in the calibration of the meter;

generating an error signal having a magnitude and polarity representative of the magnitude and polarity of the error in the calibration of the energy meter;

indicating from the error signal the magnitude and polarity of the error in the calibration of the energy meter;

adjusting the calibration means to change the angular velocity of the rotor to provide the proper calibration of the meter; and indicating changes in the magnitude and polarity of the error in the calibration as the calibration means is adjusted to provide essentially continuous adjustment in meter calibration until the signal parameter of the test signal corresponds to the predetermined relationship with the signal parameter of the reference signal to provide proper calibration.

9. The method as set forth in claim 8 including displaying a representation of the error signal.

10. The method as set forth in claim 8 wherein the predetermined signal parameter of the test signal and the predetermined signal parameter of the reference signal are frequencies.

11. The method as set forth in claim 8 wherein the step of generating the error signal includes generating said error signal with a predetermined signal parameter generally proportional to the difference in the predetermined relationship between the predetermined parameter of the test signal and the predetermined parameter of the reference signal.

12. The method as set forth in claim 8 wherein the step of sensing any difference in the predetermined relationship between the signal parameter of the reference signal and the signal parameter of the test signal comprises:

correlating different calibration values with different values of the predetermined parameter of the reference signal;

selecting a specific calibration value corresponding to the value of the parameter of the reference signal being generated; and comparing the specific calibration value to the value of the parameter of the test signal being generated; and wherein said step of generating an error signal comprises producing an error signal having a signal parameter proportional to the difference between the specific calibration value and the value of the parameter of the test signal.

* * * * *

UNITED STATES PATENT AND TRADEMARK OFFICE
CERTIFICATE OF CORRECTION

PATENT NO. : 4,766,370
DATED : August 23, 1988
INVENTOR(S) : John M. Carr

It is certified that error appears in the above-identified patent and that said Letters Patent is hereby corrected as shown below:

Column 1, line 27, after "meters", delete "." (period) and insert --,-- (comma);

Column 1, line 62, change "upplied" to --supplied--;

Column 5, line 26, "signal" should be --signals--;

Column 5, line 38, delete "error signal";

Column 6, line 47, "In it" should be --It is--;

Column 8, line 33, "senseing" should be --sensing--.

Signed and Sealed this

First Day of August, 1989

Attest:

DONALD J. QUIGG

*Attesting Officer*     *Commissioner of Patents and Trademarks*